United States Patent [19]

Hung et al.

[11] Patent Number: 5,006,436

[45] Date of Patent: Apr. 9, 1991

[54] UV CURABLE COMPOSITIONS FOR MAKING TENTABLE SOLDER MASK COATING

[75] Inventors: Paul L. K. Hung; Kenneth K. S. Tseng, both of Edison, N.J.

[73] Assignee: Atochem North America, Inc., Philadelphia, Pa.

[21] Appl. No.: 247,052

[22] Filed: Sep. 20, 1988

[51] Int. Cl.$^5$ .................. G03F 7/029; G03C 1/68; G03C 1/71
[52] U.S. Cl. .................. 430/284; 430/285; 430/288; 430/916
[58] Field of Search .............. 430/280, 281, 288, 277, 430/284; 522/49, 33

[56] References Cited

U.S. PATENT DOCUMENTS

| | | | |
|---|---|---|---|
| 4,422,914 | 12/1983 | Hung et al. | 522/33 |
| 4,458,007 | 7/1984 | Geissler et al. | 430/284 |
| 4,587,201 | 5/1986 | Morikawa et al. | 430/284 |
| 4,849,320 | 7/1989 | Irving et al. | 430/281 |

Primary Examiner—Paul R. Michl
Assistant Examiner—John S. Y. Chu

[57] ABSTRACT

A UV curable, aqueous alkaline developable solder mask composition having tenting capabilities includes a thermal free radical initiator capable of generating free radicals with heat, and a polyunsaturated compound capable of being thermally cross-linked by the free radicals to provide a substantially fully cured solder mask coating.

13 Claims, No Drawings

UV CURABLE COMPOSITIONS FOR MAKING TENTABLE SOLDER MASK COATING

BACKGROUND OF THE INVENTION

1. Field of the Invention

This invention relates to solder mask coatings having improved performance characteristics, and, more particularly it is concerned with aqueous alkaline developable, UV curable compositions for making flexible solder mask coatings having tenting capabilities.

2. Description of the Prior Art

A number of U.S. patents disclose photopolymerizable prepolymers and compositions for use as solder masks in printed circuit boards, including U.S. Pat. No. 3,660,088; 3,753,720; 3,883,352; 3,887,450; 4,199,163; 4,361,640; 4,422,914; 4,436,806; 4,458,007; 4,481,281; 4,506,004; and 4,508,916. However, none of these UV curable compounds and compositions are entirely satisfactory for use as a commercial photoimageable solder mask. A feature of a preferred photoimageable solder mask coating is an ability to be developed with an aqueous, slightly alkaline solution, thereby avoiding the use of organic solvents in the developing step. The desired solder mask coatings also should exhibit flexibility, heat and chemical resistance, surface hardness, abrasion resistance, adhesion to the underlying metal of the printed circuit board, and a high cure depth at low dosages. Particularly sought after are solder masks which exhibit a rapid curing rate and tenting capabilities. These stringent requirements imply that the UV curable compound and compositions must be carefully formulated in order that the solder mask can achieve commercial acceptability.

For example, in Rendulic, U.S. Pat. No. 4,436,806, there is described a method and apparatus for making a printed circuit board by imaging a liquid polymer which has been coated onto the board by roller coating. In this process, imaging is carried out while the polymer is wet, the phototool being positioned in a close relationship with the coated board. The liquid polymer compositions disclosed by Rendulic for use in this process are urethane acrylates having a polyether or polyester chain extending unit. These compositions have a very low viscosity which is desirable for forming coatings with a roller coater. However, these compositions have not shown tenting capabilities.

In contrast to the imaging technique of the above-mentioned patent, Sullivan, in U.S. Pat. No. 4,506,004, describes a contact method of imaging a liquid solder mask coating on a printed circuit board. In this method, the UV curable solder mask coating is screen printed to a given thickness, and imaged by exposure with suitable UV energy. The desired characteristics of good electrical performance and excellent printing resolution are the attributes of the Sullivan system. The requirements of a suitable liquid photopolymerizable composition for use in this process include an ability to form a smooth, flexible coating which can impart chemical and heat resistance to the solder mask. In addition, the coating must exhibit excellent adhesion to the board, an ability to be cured to a desired depth with a minimum of UV energy, excellent electrical insulation resistance, and tenting capabilities.

Tenting describes the ability of solder masks to cover, bridge or span an unsupported area, such as tooling holes or plated-through holes. This property is particularly sought after where the solder mask is used to produce an all copper, plated-through hole printed circuit board which is processed by panel plating to provide the desired amount of copper in the hole and on the panel surface. Such panel then is etched using the solder mask coating to protect the holes and conductor pattern. Some multi-layer boards also are made by the tent and etch process.

The tenting ability of the solder mask coating can be used to protect certain holes in a pattern plating process from receiving additional plating. This solder mask tent keeps additional electroplating material out of the non-plated-through holes.

These and other requirements of a commercial liquid photopolymerizable composition for making liquid photoimageable solder masks to augment or replace dry film solder masks are described in an article in Circuits Manufacturing, entitled "Liquids Make a Splash," pages 24–33 (January, 1987). In particular, it is stated in this article that liquid systems cause tenting problems because liquid tents over unsupported areas break when solder is applied.

Liquid solder masks also fail because uncured liquid present inside the holes is affected by gas pressure generated during baking, or when subjected to hot air leveling, that is, solder dipping operations under compressed hot air. These effects are particularly acute if the hole is 10–60 mils in diameter.

Accordingly, it is an object of this invention to provide a UV curable composition for making a solder mask having advantageous performance characteristics.

Another object of this invention is to provide a UV curable composition, which includes a mixture of UV curable compounds, for use as a solder mask, and, particularly, a composition which can be developed rapidly in an aqueous, slightly alkaline solution.

A particularly object herein is to provide a flexible solder mask coating which exhibits tenting capabilities.

Still another object herein is to provide a solder mask coating which can be rapidly cured, preferably at an energy level of less than 0.5 Joules per sq. cm., to provide a cure depth of at least 18 mils.

Another object of this invention is to provide a UV curable composition which can be coated, preferably by screen printing techniques, to form a smooth, uniform, glossy, flexible, coating up to 3 mil thickness.

Yet another object of the invention is to provide a solder mask composition which is thermally stable without gelation for at least six months.

A further object herein is to provide a flexible solder mask coating having substantially 100% adhesion to the underlying metal of the printed circuit board, particularly on copper and tin-lead.

Another object herein is to provide a solder mask product which exhibits good surface hardness, and abrasion, electrical and organic solvent resistance.

Still another object is to provide a solder mask coating having excellent heat resistance so that it does not blister after 20 seconds at 285° C.

A specific object herein is to provide a solder mask composition which is particularly adapted for use in the method and apparatus of making printed circuit boards described in U.S. Patent 4,506,004.

These and other objects and features of the invention will be made apparent from the following description of the invention.

SUMMARY OF THE INVENTION

This invention provides a UV curable composition for making a solder mask having advantageous performance characteristics. The composition of the invention includes (1) UV curable compounds, (2) a photoinitiator therefor, (3) a free radical initiator capable of being activated by heat, and (4) a polyunsaturated compound capable of being thermally cross-linked by free radicals, from which aqueous, alkaline developable, flexible solder mask coatings having tenting capabilities can be made.

The solder mask coatings herein are smooth, uniform and glossy up to 3 mil thickness, exhibit substantially 100% adhesion to the underlying metal of the printed circuit board, have good surface hardness, and abrasion, heat, electrical and organic solvent resistance.

A typical composition of the invention includes an acid functional aliphatic or cycloaliphatic urethane acrylate, a urethane diacrylate, an unsaturated polyolefin diacrylate, a reactive diluent monomer, a photoinitiator, and a thermal free radical initiator.

Such composition may comprise the following constituents, in % by weight.

(a) UV curable compounds, including:
  (i) 10–50%, preferably 15–35%, of an acid functional urethane acrylate, such as described in U.S. Patent 4,717,740;
  (ii) 5–40%, preferably 10–25%, of an aromatic urethane diacrylate;
  (iii) 2–30%, preferably 5–5%, of an aliphatic or cycloaliphatic urethane diacrylate, or mixture thereof;
(b) 5–30%, preferably 10–25%, of a thermally cross-linkable, polyunsaturated compound;
(c) 4–60%, preferably 10–20%, of at least one reactive monomer diluent;
(d) 0.5–10%, preferably 1–3%, of a photoinitiator; and
(e) 0.2–5%, preferably 0.5–1%, of a free radical thermal initiator.

The composition of the invention also may include one or more of the following: a thermal cross-linking agent, a pigment or dye, a flame retardant, a rheology modifier, a thermal stabilizer, and a pigment dispersion aid.

DETAILED DESCRIPTION OF THE INVENTION

While certain UV curable compounds are disclosed herein, in particular, urethane acrylates, it will be understood that other known UV curable compounds may be used as well in combination with a polysaturated compound which is capable of being thermally cross-linked by free radicals. For example, UV curable compounds generally useful in solder mask compositions, such as urethane acrylates and epoxy acrylates, described in the aforelisted U.S. patents, may be used herein. The urethane acrylate compounds of U.S. Pat. No. 4,874,799 and of copending U.S. patent application Ser. No. and 195,059 filed and 5/17/88, by the same inventors herein and assigned to the same assignee, are other examples of UV curable compounds suitable for use herein. The disclosures of that patent and application are incorporated by reference herein.

A typical urethane acrylate compound is obtained by reacting:
  (i) two moles of a diisocyanate, e.g. an aliphatic, cycloaliphatic, aromatic diisocyanate, or aromatic-aliphatic diisocyanate or mixtures thereof, e.g. dicyclohexylmethylene diisocyanate, isophorone diisocyanate, hexamethylene diisocyanate, toluene diisocyanate and phenyldialkylene diisocyanate;
  (ii) one mole of a hydroxyalkyl acrylate or a hydroxy extended-alkyl acrylate; e.g. hydroxypropyl acrylate or a caprolactone acrylate monomer;
  (iii) one mole of a polyol; e.g. ethylene glycol;
  (iv) one mole of a simple alkylene polyol compound having 3–6 hydroxyl groups and 3–6 carbon atoms; e.g. glycerol; and
  (v) at least one mole of a dicarboxylic acid or anhydride, saturated or unsaturated; e.g. maleic anhydride.

This urethane acrylate oligomer is characterized by the following chemical constituents:
  (a) terminal ethylenic unsaturation;
  (b) at least one terminal carboxylic acid group;
  (c) two intermediate urethane groups;
  (d) a group derived from a polyol with two hydrogen atoms removed connecting the urethane groups; and
  (e) a simple alkylene group derived from a simple alkylene polyol with at least two hydrogen atoms removed connecting one of the urethane groups and the terminal carboxylic acid group.

Another urethane acrylate compound of Ser. No. 159,059, is the following:

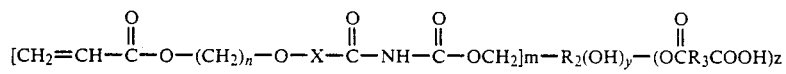

where:
n is 1–8,
X is derived from a caprolactone, caprolactan or epoxide,
$R_1$ is an aliphatic or cycloaliphatic group,
m is 1–3,
$R_2$ is alkylene $C_1$–$C_6$,
y is 0–3,
$R_3$ is aliphatic or cycloaliphatic, saturated or unsaturated, or aromatic; and
z is 1–3.
Preferably, n is 2–3;

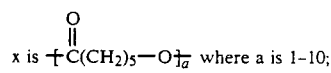

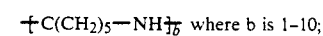

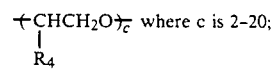

$R_1$ is dicyclohexylmethylene;
m is 1 or 2;
$R_2$ is derived from glycerol;
y is 0 or 1;
$R_3$ is derived from maleic anhydride,
z is 1, $3 \leq m+y+z \leq 6$; and
$R_4$ is H or alkyl. A typical compound is:

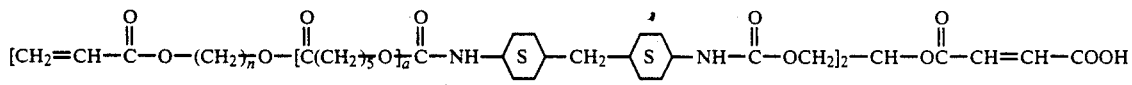

in which $m=2$, $z=1$ and $y=0$.

Another preferred compound in the above formula is one in which $m=1$, $z=1$ and $y=1$.

Another suitable acid functional urethane acrylate compound is described in U.S. Pat. No. 4,717,740; it is obtained by reacting (1) at least one diisocyanate compound selected from the group consisting of aliphatic and cycloaliphatic diisocyanates, e.g. dicyclohexylmethylene diisocyanate, isophorone diisocyanate, and hexamethylene diisocyanate, (2) one mole of a hydroxyalkyl acrylate; e.g. hydroxypropyl acrylate, (3) an alkylene polyol having 3-6 hydroxyl groups, and 3-6 carbon atoms, e.g. glycerol; and (4) at least one mole of a dicarboxylic acid anhydride, saturated or unsaturated, e.g. maleic anhydride.

Such acid functional urethane acrylate compound is characterized by (a) terminal ethylenic unsaturation; (b) at least one terminal carboxylic acid group; and (c) alkylene connecting groups intermediate said terminal groups, one of which preferably is substituted with at least one hydroxy group.

The acid functional urethane acrylate component of the mixture of UV curable compounds provides the desired flexibility characteristics, aqueous alkaline developability, adhesion, surface hardness, and high cure depth at a low energy level; and the thermally crosslinkable curable compound provides tenting capabilities.

A typical composition of the invention is as follows:

| | | Composition of Invention | |
|---|---|---|---|
| Component | | Suitable % by Weight | Preferred % by Weight |
| (i) | Urethane acrylate | 10-50 | 15-35 |
| (ii) | Urethane diacrylate (aromatic) | 5-40 | 10-25 |
| (iii) | Urethane diacrylate (aliphatic or cycloaliphatic) | 2-30 | 5-15 |
| (iv) | Polyunsaturated compound | 5-30 | 10-25 |
| (v) | Reactive diluent monomer | 4-60 | 10-20 |
| (vi) | Photoinitiator | 0.5-10 | 1-3 |
| (vii) | Thermoinitiator | 0.2-5 | 0.5-1 |

The reactive diluent monomers are included in the composition of the invention to reduce its viscosity and increase its curing rate. Suitable reactive diluent monomers for use therein include ethylenically unsaturated monomers that are compatible and copolymerizable with the substituted urethane acrylate and urethane diacrylates of the invention. Such ethylenically unsaturated monomers include mono-, di-, and tri-acrylates as, for example, hydroxyalkyl acrylates, such as e.g. hydroxyethyl acrylate; and acrylate esters, e.g. methyl methacrylate, ethyl acrylate, 2-ethylhexyl acrylate, cyclohexyl acrylate, isobutoxymethyl methacrylate, t-butyl acrylate, methyl acrylate, butyl acrylate, 2-(N-ethylcarbamyl) ethyl methacrylate; aryloxyalkyl acrylates, e.g. phenoxyethyl acrylate; bis-phenol-A diacrylate, glycerol diacrylate and methacrylate, bis-phenol A diacrylate, tetrapropylene glycol diacrylate, and the like. Suitable triacrylates include glycerol triacrylate, ethoxylated trimethylol propane triacrylate, and the like.

Other reactive compounds can be included in the composition of the invention to increase the cross-linking density of the coating. Such reactive compounds include, but are not limited to, pentaerythritol 3-mercaptopropionate, 1, 4-butylene dimethacrylate or acrylate, 1,1,6,-6-tetrahydroperfluorohexanediol diacrylate, ethylene dimethacrylate, glycerol diacrylate or methacrylate, glycerol trimethacrylate, diallyl phthalate and 1, 3, 5-tri(2-methacryloxyethyl)-s-triazine.

The UV curable composition of this invention also contains a photoinitiator which generates free radicals owing to actinic light. Suitable examples of such photoinitiators include substituted and unsubstituted polynuclear quinones, such as 2-ethylanthraquinone, 2-t-burylanthraquinone, octamethylanthraquinone, 1,2-benzanthraquinone, 2,3-diphenylanthraquinone, thioxanthone, e.g. chloro and isopropyl derivatives, and the like; α-ketoaldonyl compounds such as diacetyl, benzyl and the like; 2-ketoaldonyl alcohols and ethers, such as benzoin, pivalone, and the like; 2-hydrocarbon-substituted aromatic acyloins such as 2-phenylbenzoin, 2,2-diethoxyacetophenone, and the like, and aromatic ketones such as benzophenone, 4,4'''-bisdialkylaminobenzophenone, and the like. These photoinitiators may be used alone or as a combination of two or more of them. Examples of combinations include 2,4,5-triarylimidazole dimer and 2-mercaptobenzoquinazole, leucocrystal violet, tris(4-diethylamino-2-methylphenyl) methane, or the like, and compounds which may not have photoinitiating properties alone but which nevertheless can constitute a good photoinitiating system, in combination with the above-mentioned materials. Such compounds include, for example, tertiary amines, such as triethanolamine and the like, which are used in combination with benzophenone.

These photoinitiators and/or photoinitiator systems preferably are present in an amount of about 0.5 to 10% by weight of the composition.

The free radical thermal initiator component of the composition can generate free radicals upon heating. Representative thermoinitiators for generating the desired free radicals and to effect thermal cross-linking of the polyunsaturated compound disclosed herein include peroxides, such as dicumyl peroxide, benzoyl peroxide, di-t-butyl peroxide and di-t-butyl perbenzoate; azos, such as Luazo-a trademark of 96(Pennwalt) Corporation of Philadelphia, Pa.

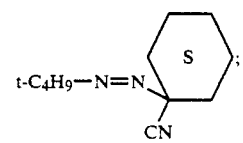

disulfides, polysulfides and mercaptans, such as bis-[(3-[triethoxysilyl]-propyl)-tetrasulfide (Si 69-Degussa), diphenyl disulfide, dithio-bis(stearyl propionate), dithiodipropionic acid, thiolactic acid, α-mercaptopropionic acid, iso-octyl thioglycolate, calcium thioglycolate, 1-thioglycerol, benzyl mercaptan, dithioglycolic acid, mercapto ethyl adipate, glycerol trithioglycolate, trimethylol propane trithioglycolate and pentaerythritol tetra(mercapto propionate).

The free radicals generated by the thermal initiator can thermally cross-link the polyunsaturated component of the liquid solder mask across and within the hole, thereby solidifying the liquid and improving the tenting capabilities of the composition. A typical polysaturated compound is a polysaturated alkylene diol diacrylate, which is thermally curable by such free radicals. A suitable compound is polybutadiene diol and its diacrylate, which are obtainable from the Sartomer Co. as "C-5000." Copolymers of butadiene also may be used. For example, carboxy terminated butadiene-acrylonitrile copolymers, such as the Hycar (Goodrich) reactive liquid polymers also may be used. These include, for example, the Hycar CTBN and CTBNX copolymers,

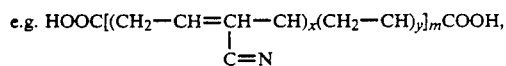

where m is about 7; and the Hycar RLP, CT, AT, VT and HT liquid polymers. "Hycar" is a trademark of the B. F. Goodrich Company of Akron, Ohio.

The invention will be illustrated in more detail in the following examples.

EXAMPLE 1

Preparation of Urethane Acrylates

Urethane acrylates which are aqueous developable oligomers were obtained in the manner described in U.S. Pat. No. 4,717,470 (Example 1).

EXAMPLE 2

Preparation of Aromatic Urethane Diacrylate

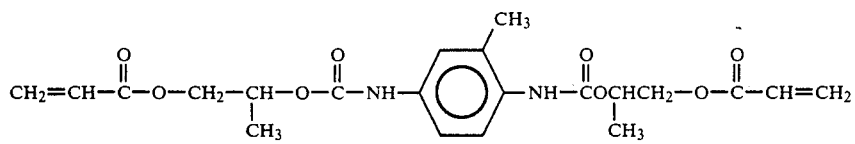

Toluene diisocyanate (1 mole) and hydroxypropyl acrylate (2 moles) were reacted at 55° C. for 6 hrs. to give the product, which was a viscous liquid having a Brookfield viscosity of 68,000 cps at 50° C.

EXAMPLE 3

Aliphatic Urethane Diacrylate Aliphatic urethane diacrylates were available (1) as Photomer-6008 from Diamond Shamrock Corp. or (2) as SR-9503 from Sartomar Co. (100% reactive materials).

EXAMPLE 4

The following composition was prepared and used in forming a solder mask composition for a printed circuit board.

| COMPOSITION | |
|---|---|
| Component | Parts by Wt. |
| Urethane acrylate of Ex. 1 | 23 |
| Aromatic Urethane diacrylate of Ex. 2 | 17.5 |
| Aliphatic Urethane diacrylate of Ex. 3 | 9 |
| Tone M-100 (Union Carbide) and other reactive diluent monomers | 20 |

| -continued | |
|---|---|
| COMPOSITION | |
| Component | Parts by Wt. |
| CAB-O-SIL thixotropic agent | 4 |
| Cymel 301 (Am. Cyan.) - thermal cross-linker | 8 |
| Irgacure 651 (Ciba-Geigy) photoinitiator | 2 |
| Copper Phthalocyanine - green pigment | 0.3 |
| Colloid 640 (Colloid Chem.) - leveling agent | 0.8 |
| MTBHQ - mono-tert.-butyl hydroquinone-stabilizer | 0.2 |
| Triphenylphosphite-cure depth accelerator | 1 |
| Decabromodiphenyl oxide and antimony trioxide - flame retardant | 8 |
| Polybutadienediol diacrylate - polyunsaturated part is thermally curable | 17 |
| Benzoyl peroxide - thermal free radical initiator | 0.5 |

This composition has a Brookfield viscosity of 15,000 cps at 100 rpm at 23° C., and is stable without gelation for more than 1 year.

EXAMPLE 7

Preparation of Cured Solder Mask Coating

A copper-clad epoxy fiber glass printed circuit board having a plurality of holes with diameters ranging from 10 to 60 mils was cleaned by scrubbing to remove corrosion and foreign material and coated by screen printing with the composition of Example 6 to a thickness of about 3 mils. Then another 3 mil thick coating was applied onto a phototool in accordance with the method given in U.S. Pat. No. 4,506,004, Example 2. The two coatings then can be given a flash curing if desired, with about 0.05-0.1 Joules per cm² of energy, using a mercury vapor lamp, to effect partial hardening. The two coatings then were mated to form a composite coating of 6 mils thickness, flipped over and given a main exposure with 0.2-0.5 Joules per cm² The unexposed coating then was developed by removing it (negative working) in a 1% sodium carbonate solution (pH 11) at room temperature, baked or IR heated at 150° C. for 1 hr., and finally cured with 2.5 Joules per cm² of UV energy.

The cured solder mask coating was a smooth, uniform, glossy, and flexible coating having 100% adhesion under a crosshatch tape test both before and after application of solder; it was resistant to organic solvents for more than 15 minutes in an immersion test; and exhibited excellent heat resistance as measured by conventional hot air leveling equipment, which indicates good tenting capabilities; possessed a surface pencil hardness of greater than H, and very good abrasion resistance; had excellent adhesion to the printed circuit board, and an electrical insulation resistance which exceeds Class III (IPC) requirements of 5×10⁸ ohm-cm. after 7 days at 25°-65° C. cycling at 90% R.H.

While the invention has been described with particular reference to certain embodiments thereof, certain changes and modifications may be made which are within the skill of the art. It is intended to be bound only by the appended claims, in which:

What is claimed is:

1. A UV curable, aqueous alkaline developable, solder-mask composition comprising:
   (a)
      (i) 10–50% by wt. of a urethane acrylate compound which is obtained by reacting substantially equal molar quantities of an aliphatic or cycloaliphatic diisocyanate, and a hydroxyalkyl acrylate, with an alkylene polyol having 3-6 hydroxyl groups, and 3-6 carbon atoms, with at least one mole of a dicarboxylic acid anhydride per mole of said alkylene polyol,
      (ii) 5–40% by wt. of an aromatic urethane diacrylate,
      (iii) 2–30% by wt. of an aliphatic or cycloaliphatic urethane diacrylate,
   (b) 5–30% by wt of a thermally cross-linkable polyunsaturated compound;
   (c) 4–60% by wt. of at least one reactive monomer diluent;
   (d) 0.5–10% by wt. of a photoinitiator; and
   (e) 0.2–5% by wt. of a free radical thermal initiator wherein the urethane acrylate compound has terminal ethylenic unsaturation.

2. A composition according to claim 1 wherein in (i) said aliphatic or cycloaliphatic diisocyanate is selected from the group consisting of dicyclohexylmethylene diisocyanate,, isophorone diisocyanate and hexamethylene diisocyanate.

3. A composition according to claim 1 wherien in (i) said alkylene polyol is glycerol.

4. A composition according to claim 1 wherein said reactive monomer diluent includes a mono-, di- or tri-acrylate monomer.

5. A composition according to claim 1 wherein said raective monomer diluent includes a hydroxyalkyl acrylate.

6. A composition according to claim 1 wherein (b) is a polyunsaturated alkylene diol or diacrylate.

7. A composition according to claim 1 wherein said urethane acrylate compound is characterized by terminal ethylenic unsaturation, at least one terminal carboxylic acid group, and an alkylene group intermediate said terminal groups substituted with a hydroxyl group.

8. A composition according to claim 1 wherein said urethane acrylate compound has terminal ethylenic unsaturation, at least two terminal carboxylic acid groups, and an alkylene group intermediate said terminal groups optionally substituted with a hydroxyl group.

9. A UV curable, aqueous alkaline developable composition according to claim 1 wherein said urethane acrylate compound has the formula:

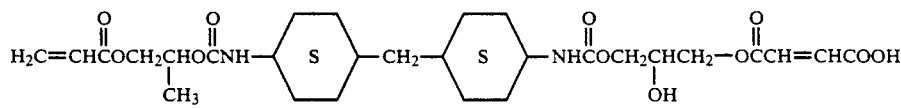

10. A composition according to claim 1 which includes 0.1–15 wt % each of one or more of the following: a pigment or dye, a flame retardant, a rheology modifier, a thermal stabilizer and a pigment dispersion aid.

11. A method of forming a flexible, aqueous alkaline developable solder mask exhibiting tenting capabilities which comprises the steps of:
   (a) applying the composition of claim 1 to a printed circuit board,
   (b) curing said coating, and
   (c) developing said thus-exposed coating with an aqueous, alkaline solution.

12. A solder mask composition which includes a UV curable compound and reactive monomer diluents, characterized by including:
   (a) a thermal free radical initiator capable of generating free radical with heat, and
   (b) a polyunsaturated compound capable of being thermally cross-linked by said free radicals to provide a substantially fully cured solder mask coating having improved tenting capabilities both across and within holes in a printed circuit board.

13. A cured solder mask coating having tenting capabilities both across and within holes in a printed circuit board, which coating contains a polyunsaturated compound thermally cross-linked by free radicals.

* * * * *